(12) United States Patent
Erez

(10) Patent No.: US 8,041,879 B2
(45) Date of Patent: Oct. 18, 2011

(54) FLASH MEMORY BACKUP SYSTEM AND METHOD

(75) Inventor: Eran Erez, Gedera (IL)

(73) Assignee: SanDisk IL Ltd, Kfar Saba (IL)

( * ) Notice: Subject to any disclaimer, the term of this patent is extended or adjusted under 35 U.S.C. 154(b) by 419 days.

(21) Appl. No.: 11/318,863

(22) Filed: Dec. 28, 2005

(65) Prior Publication Data

US 2006/0198202 A1    Sep. 7, 2006

Related U.S. Application Data

(60) Provisional application No. 60/653,976, filed on Feb. 18, 2005.

(51) Int. Cl.
G06F 11/16 (2006.01)
G06F 11/00 (2006.01)

(52) U.S. Cl. ........ 711/103; 711/154; 711/161; 711/162; 714/6.2; 714/6.3; 714/6.32; 714/16

(58) Field of Classification Search .................. 711/103, 711/154, 161, 162; 714/6.2, 6.3, 6.32, 16
See application file for complete search history.

(56) References Cited

U.S. PATENT DOCUMENTS

| | | | | |
|---|---|---|---|---|
| 5,426,774 A | * | 6/1995 | Banerjee et al. | 714/16 |
| 5,887,270 A | * | 3/1999 | Brant et al. | 711/162 |
| 6,038,680 A | * | 3/2000 | Olarig | 714/6 |
| 6,338,126 B1 | * | 1/2002 | Ohran et al. | 711/162 |
| 6,601,132 B2 | | 7/2003 | Nomura | |
| 6,788,609 B2 | | 9/2004 | Yamagami | |
| 7,634,507 B2 | * | 12/2009 | Atluri et al. | 1/1 |
| 7,774,537 B2 | * | 8/2010 | Pyeon et al. | 711/103 |
| 2002/0026566 A1 | * | 2/2002 | Awada et al. | 711/162 |
| 2010/0287433 A1 | * | 11/2010 | Mu | 714/746 |
| 2011/0002165 A1 | * | 1/2011 | Fukuda | 365/185.03 |

OTHER PUBLICATIONS

Tanenbaum, A. S. Structured Computer Organization. 1984. Prentice Hall Inc. 2nd ed. pp. 10-12.*
PC Guide. RAID level 1. Archive.org date of Feb. 11, 2001. http://www.pcguide.com/ref/hdd/perf/raid/levels/singleLevel1-c.html.*

* cited by examiner

Primary Examiner — Sanjiv Shah
Assistant Examiner — Samuel Dillon
(74) Attorney, Agent, or Firm — Martine Penilla & Gencarella, LLP

(57) ABSTRACT

A flash memory system includes a flash controller for controlling operation of at least two flash memory devices. A page buffer is allocated within each flash memory device, such that one page buffer functions as a designated target buffer and another page buffer functions as a mirror buffer. The flash controller transmits the page data to two flash memory devices simultaneously, such that no backup of the page data is required to be kept in the flash controller. Hence, there is no delay in writing the next page data from a host computer to the flash controller.

10 Claims, 3 Drawing Sheets

FLASH MEMORY BACKUP SYSTEM AND METHOD

CROSS-REFERENCE TO RELATED APPLICATIONS

This patent application claims the benefit of U.S. Provisional Patent Application No. 60/653,976, filed Feb. 18, 2005.

FIELD OF THE INVENTION

The present invention relates to the field of flash memory devices. More particularly, the present invention relates to storing data within a flash memory device.

BACKGROUND OF THE INVENTION

Storage media are an integral part of many electronic systems used today and is provided to serve a variety of purposes. The memory technology used for storage can be based on various technologies known in the art, e.g. magnetic discs, solid-state hard disks, etc.

A solid-state disk technology commonly uses flash memory devices to store data. A flash memory device is a form of EEPROM (Electrically Erasable Programmable Read-Only Memory) that allows multiple memory locations to be erased or written in one programming operation. In lay terms, it is a form of rewritable memory chip that, unlike a Random Access Memory chip, holds its content without the need of a power supply. The memory is commonly used in Memory cards, USB Flash drives, MP3 players, digital cameras and mobile phones.

Flash memory is based on the Floating-Gate transistor, which is essentially an NMOS transistor with an additional conductor suspended between the gate and source/drain terminals.

Devices based on a NAND-type flash memory have certain limitations and must be handled in a specific manner. One of these limitations is that a flash memory device may fail during a programming (write) operation. When a programming failure occurs, a recovery algorithm must be activated, or the data may be lost. This algorithm requires allocating memory resources for temporary storage. When programming a page of data in the flash memory, a copy of the written data must be kept as a backup. If the programming operation is successful, then the backed-up data are no longer required. If the programming operation fails, the backed-up data is rewritten to a different location on the flash memory.

Flash memory devices known in the art, commonly allocate memory resources used for temporary and backup storage on the flash controller component.

Some interfaces, such as SCSI (Small Computer System Interface), support a re-transmission mechanism if and when the flash memory reports a programming failure event. However, this solution is not supported by all interfaces (for example, IDE—Integrated Drive Electronics).

Prior art systems and methods utilizing the flash controller memory for temporary storage include U.S. Pat. No. 6,601,132 to Nomura et al. and U.S. Pat. No. 6,788,609 to Yamagami et al.

The Nomura patent discloses a rewritable nonvolatile memory, comprising a block usage control table indicating a usage status of each block of the nonvolatile memory. According to the Namura patent, data is transmitted by the host device and stored in a write data buffer of a RAM on a block-by-block basis. When the data is written, the block usage control table enables determining whether or not the data is correctly written. If the data is not correctly written, the block address is stored as a candidate address of a defective block and writing operation is performed for another block. However, if the data is correctly written, the block usage control table updates the usage status of this block to a used status.

The Yamagami patent discloses a semiconductor disk, wherein a flash memory into which data is rewritten in block unit is employed as a storage medium. The semiconductor disk comprises a data memory for storing file data, a substitutive memory which substitutes for blocks of errors in the data memory, an error memory buffer in which error information (write failure) of the data memory are stored, and a memory controller which reads data out of, writes data into and erases data from the data memory, the substitutive memory and the error memory. Because the write errors of the flash memory can be remedied, the service life of the semiconductor disk can be increased.

A prior art flash memory system architecture 10 is shown in FIG. 1, in relation to the basic architecture of the Nomura and the Yamagami patents. System 10 includes a flash controller 12 operative to control flash memory devices 14.

Both the flash controller 12 and flash memory device 14 allocate areas in memory for temporary storage (numerals 16 and 18 respectively). Flash controller 12 employs a memory resource (such as SRAM 16) for temporarily storing code and/or data that flash controller 12 uses when executing operations in its CPU. Each flash memory device 14 includes a page buffer 18 for storing page data prior to programming the page data content to the non-volatile section of the flash memory.

However, existing approaches, which allocate memory resources for temporary storage on the flash controller, require using the flash controller memory to back up page data until page programming is completed successfully. Since the flash controller may need a backup copy of the page data in case of a write failure, a backup copy is kept in the flash controller's SRAM buffer. Therefore, the next page data write operation from the host computer to the flash controller is delayed until it is verified that no write failure occurred. Only when page programming is completed successfully, is the backup copy kept in the flash controller overwritten with new data.

Furthermore, such approaches employ system resources that might otherwise be eliminated or used for other tasks.

Therefore, there is a strong need to provide an innovative and reliable system and method for utilizing an area of memory for temporary storage on a page buffer of the flash memory device itself, rather than on the flash controller, while overcoming the limitations caused when utilizing the flash controller memory for temporary storage.

SUMMARY OF THE INVENTION

Accordingly, it is a principal object of the present invention to overcome the disadvantages of prior art techniques used for managing a flash memory device.

The present invention discloses an improved and efficient system and method for utilizing an area of memory for temporary storage on a page buffer of the flash memory device itself, rather than on the flash controller.

The proposed flash memory system, in accordance with a preferred embodiment of the present invention, includes a flash controller for controlling operation of at least two flash memory devices. A page buffer is allocated within each flash memory device, such that a first page buffer functions as a designated target buffer and a second page buffer functions as a mirror buffer.

Temporary data are transmitted to the two flash memory devices, preferably simultaneously. Therefore, the implementation of the proposed method does not require using the flash controller memory to back up page data until page programming to the non-volatile memory of the designated flash memory device is completed successfully.

Furthermore, the area designated for temporary storage on the flash controller can be completely removed or allocated for other purposes.

Hence, improved speed performance and cost reduction is achieved. In price-sensitive applications, this may be a key factor in lowering the product price.

In accordance with the present invention, there is provided a flash memory system including: (a) at least two flash memory devices, wherein at least one page buffer is allocated within each of the at least two flash memory devices; and (b) a controller for controlling a programming of data into a first flash memory device by steps including transmitting the data from the controller both to a page buffer of the first flash memory device and to a page buffer of a second flash memory device.

The control over the programming may be implemented in software, in hardware or in a combination of software and hardware.

Preferably, the controller is operative to transmit the data substantially simultaneously to both the page buffers. Alternatively, the controller is operative to transmit the data consecutively to the page buffers.

Preferably, the flash memory system also includes a mechanism for checking a programming failure of the programming of the data in the first flash memory device. Most preferably, the controller is operative to program the data into the second flash memory device in case of the programming failure in the first flash memory device. Also most preferably, the controller is operative, subsequent to the programming of the data into the second flash memory device, to read the data from the second flash memory device.

Preferably, the flash memory devices are NAND flash memory devices.

In accordance with the present invention, there is further provided a method for managing a flash memory system, the method including the steps of, upon the flash memory system receiving an instruction from a host to store data, obeying the instruction by: (a) transmitting data to a first page buffer allocated within a first flash memory device of the flash memory system; and (b) also transmitting the data to a second page buffer allocated within a second flash memory device of the flash memory system.

Preferably, the data are programmed to a non-volatile memory of the first flash memory device. More preferably, the programming of the data to the non-volatile memory of the first flash memory device is checked for failure. Still more preferably, if the checking indicates that the programming of the data to the non-volatile memory of the first flash memory device has failed, the data are programmed to a non-volatile memory of the second flash memory device. Most preferably, subsequent to the programming of the data into the non-volatile memory of the second flash memory device, the data are read from the non-volatile memory of the second flash memory device.

Preferably, data are transmitted substantially simultaneously to both the page buffers. Alternatively, data are transmitted consecutively to both the page buffers.

Additional features and advantages of the invention will become apparent from the following drawings and description.

BRIEF DESCRIPTION OF THE DRAWINGS

For a better understanding of the invention with regard to the embodiments thereof, reference is made to the accompanying drawing, in which like numerals designate corresponding sections or elements throughout, and in which.

DETAILED DESCRIPTION OF THE PREFERRED EMBODIMENTS

The present invention is a system and method for utilizing an area of memory for temporary storage on a page buffer of the flash memory device itself, rather than on the flash controller.

A preferred embodiment of the flash memory system of the present invention includes a flash controller for controlling operation of at least two flash memory devices. A page buffer is allocated within each flash memory device, such that a first page buffer functions as a designated target buffer and a second functions as a mirror buffer. The flash controller controls the transmission of data from the flash controller to the two page buffers and the programming of data from the designated target buffer to the non-volatile memory of the required flash memory device.

A mechanism for checking a programming failure to the designated target buffer is further provided. In the event of a programming failure, the page data is not lost, since a copy of the original page data is available and ready in the mirror page buffer. Such a mechanism may be embedded within the flash controller.

The proposed method is implemented in firmware and/or hardware.

The present invention overcomes the limitations caused when utilizing the flash controller memory for temporary storage. Firstly, there is no performance penalty, because the implementation of the present invention does not require using the flash controller memory to back up page data until page programming is completed successfully. Therefore, there is no delay in writing the next data page from the host computer to the flash controller. Additionally, the transmission of data to the two flash memory devices is carried out simultaneously, and therefore no time penalty is incurred.

Secondly, there is no cost penalty, since this memory area in the page buffer is present in every flash memory device. Furthermore, the area designated for temporary storage on the flash controller can be completely removed or allocated for other purposes, such as code storage.

Hence, improved speed performance and cost reduction is achieved. In price-sensitive applications, this often is a key factor in lowering the product price.

An example of a flash memory device for which the present invention is applicable is Samsung Electronics device No. K9K2GO8U0A. The datasheet of that flash memory device is incorporated by reference for all purposes as if fully set forth herein.

However, the present invention is not limited to this specific flash memory device. It should be understood that the present invention is not limited to one designated set of target/mirror buffers. Other implementations are possible within the scope of the invention, thus relating to a plurality of flash memory devices of any type containing a plurality of page buffers.

Figure 1:
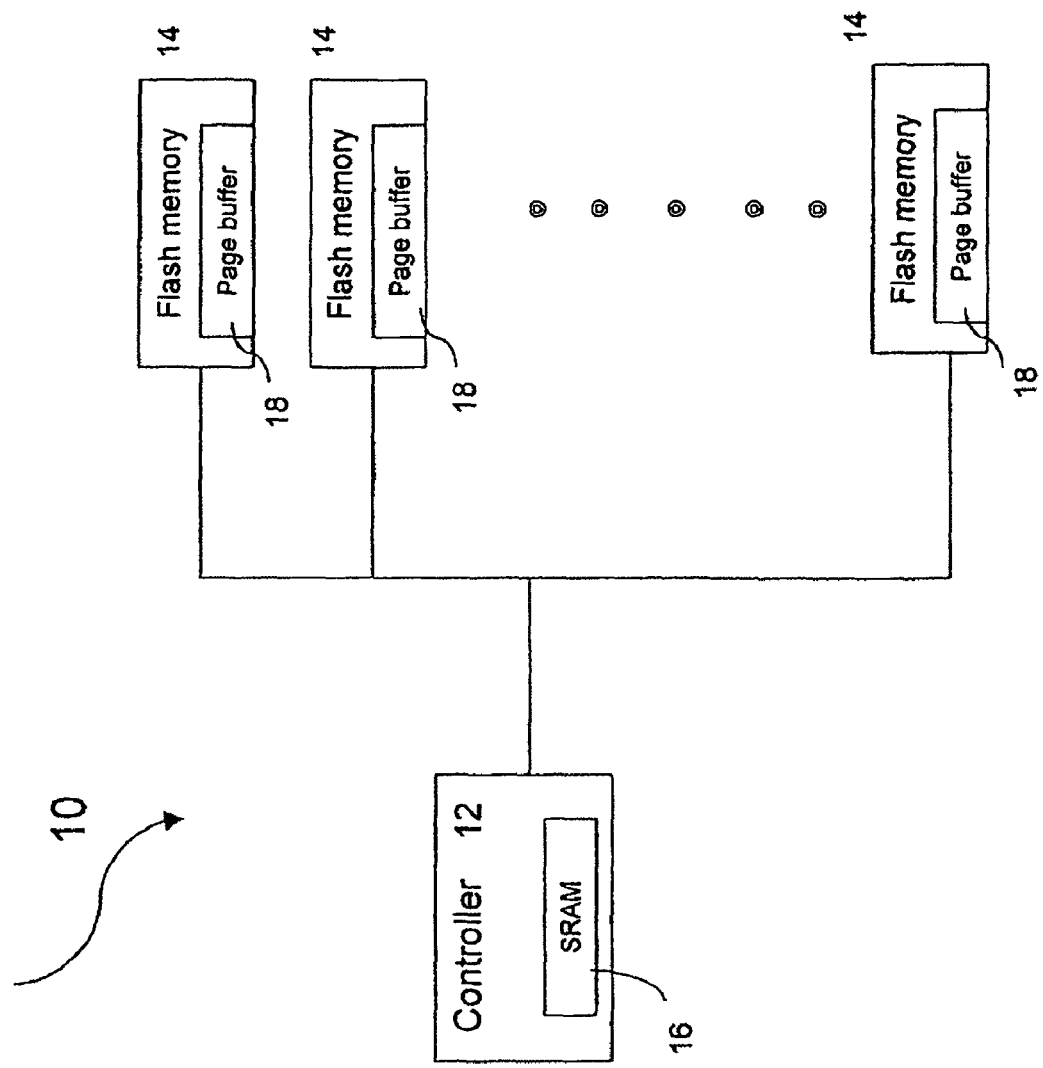
FIG. 1 is a block diagram of a prior art flash memory system architecture.
Figure 2:
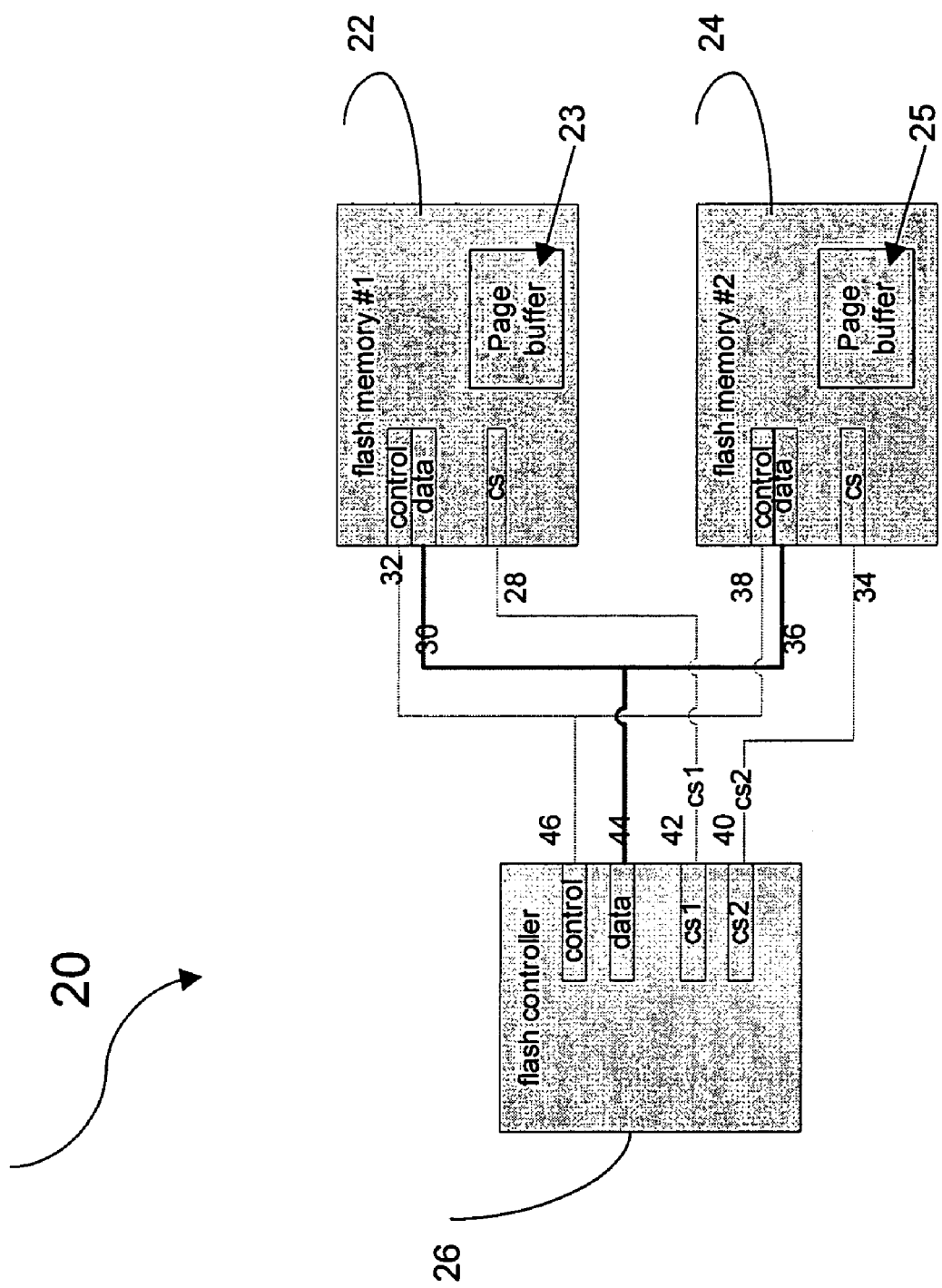
FIG. 2 is a block diagram of a preferred embodiment of the flash memory system of the present invention.

Referring now to FIG. 2, there is shown a block diagram of a flash memory system 20 of the present invention. System 20 includes a flash controller 26 connected to two flash memory devices 22 and 24, wherein each flash memory device (22, 24) contains a page buffer (23, 25 respectively).

Flash controller 26 is provided to control the programming of page data to a designated flash memory device while using a mirror buffer as a backup for programming failure events. For example, if the page data is defined to be programmed to flash memory device 22, then page buffer 23 functions as the designated target buffer, while the backup data is stored in the page buffer 25 of flash memory device 24 functioning as the mirror buffer, and vise-versa. The functionality of flash buffers 23 and 25 is alternately swapped, according to the operation carried out by the flash controller 26 hardware signals 40, 42, 44 and 46.

In accordance with the preferred embodiment of the present invention, flash controller 26 asserts Chip Select (CS) signals 40, 42 in order to activate the required flash memory device(s). When a CS signal is negated, the associated flash memory device is not active. Each flash memory device (22, 24), whose CS signal (28, 34 respectively) is asserted, monitors its data bus (30, 36) and control bus (32, 38), according to the flash controller's 26 data bus 44 and control bus 46. When both CS signals 40, 42 are asserted, the two flash memory devices 22, 24 are activated simultaneously.

Figure 3:
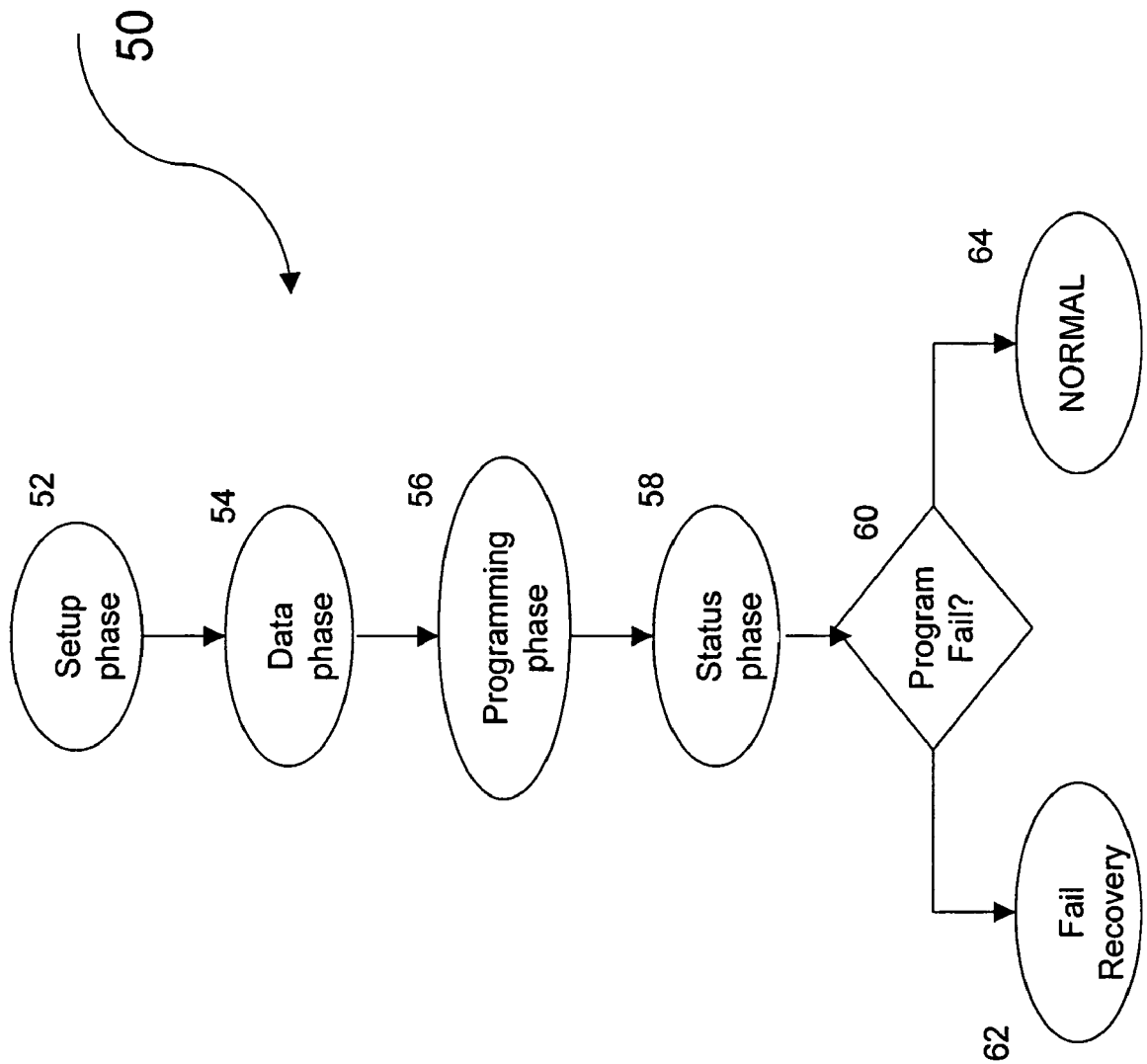
FIG. 3 is a flow chart of a preferred embodiment of the method of the present invention.

Referring to FIG. 3, there is shown a flow chart of a preferred method of the present invention.

At the initial step 52, the Setup phase, the command type (e.g. a write command) is defined along with the designated flash memory device to which page data should be written. Consequently, the page buffer functioning as the designated target buffer (to which the page data will be written) (e.g. page buffer 23) and the page buffer functioning as the mirror buffer (to which the backup data will be written) (e.g. page buffer 25) are also known. During the initial phase both CS signals are asserted, thus activating the two flash memory devices 22 and 24 simultaneously. The flash controller 26 sends a command code for initiating a programming operation while defining the page address within the designated flash memory device (i.e. into which the programming operation should store the data). After this phase is completed, both flash memory devices are set up to accept page data to be programmed.

At the next step, the Data phase 54, again both CS signals (40, 42) of flash controller 26 (see FIG. 2) are asserted, thus activating the two flash memory devices (24, 22 respectively). During this phase, flash controller 26 transmits the page data to both flash memory devices simultaneously via data bus 44. After the data transmission is completed, the two page buffers (23, 25) on both flash memory devices (22, 24 respectively) contain the same page data ready to be programmed. At the next step, the Programming phase 56, the flash memory device containing the designated target buffer is issued a 'program' command and programs the page data to its non-volatile area. During this phase, only the CS signal of this flash memory device is asserted, allowing only the designated flash memory device to be programmed.

At the next step, the Status phase 58, the flash controller 26 reads the operation status transmitted via control bus 46 in order to verify that the programming operation to the designated flash memory device was successful, and that no write failure has occurred. During this phase, only the CS signal of the flash memory device containing the designated target buffer is asserted.

At the next step 60, it is determined by the flash controller 26 whether a programming failure event has occurred.

In the event of a programming failure, step 62, the data page is not lost, because a copy of the original data page (i.e. backup page data) is available and ready in the mirror page buffer. In this case, the CS signal of the flash memory device containing the mirror buffer is asserted, followed by re-activation of steps 56 to 64 (wherein the mirror buffer functions as the designated target buffer). This results in the page data being programmed into the non-volatile memory of the flash memory device containing the mirror buffer, from which place it can be read by the controller and written again into a desirable location.

The probability of the programming of the original page data and the programming of the backup page data both failing is so low that such a contingency is ignored by the present invention.

The above method results in programming the page data into the flash memory device containing the mirror buffer at exactly the same address defined for programming into the flash memory device containing the target buffer. This may be undesirable, as that address might already be in use for existing data in the flash memory device containing the mirror buffer. In such case, the two flash memory devices are set to different addresses—the flash memory device containing the designated target buffer is set to program the data into a desired address, while the flash memory device containing the mirror buffer is set to program the data into a preset address that is pre-selected by the controller to be available for use for such an error recovery purpose.

Defining two separate addresses requires modifying Setup phase 52 accordingly, such that in a first phase—a first CS signal is asserted for activating the flash memory device containing the designated target buffer only and providing the desired address. Whereas in a second phase—a second CS signal is asserted for activating the flash memory device containing the mirror buffer and providing the pre-selected address for programming the backed-up data in case of programming failure.

If no programming failure has occurred, step 64, flash controller 26 continues to operate according to the current application, and no use is made of the backup copy of the data residing in the mirror buffer. However, no performance penalty was incurred, since as stated above—the transmission of the page data to the mirror buffer is achieved in parallel to the transmission of the page data to the designated target buffer and did not require an additional transmission procedure.

In accordance with the preferred embodiment of the present invention, the proposed flash memory system uses Chip Select (CS) signals for activating the required flash memory device(s). However, activation of the required flash memory device(s) and selection of which of the flash memory device(s) will respond to a specific command or address can be further obtained using other approaches known in the art, such as by using Write Enable (WE) signals.

In accordance with another embodiment of the present invention, the proposed method may also be executed by programming the page data to both flash memory devices (both the one containing the designated target buffer and the one containing the mirror buffer) in parallel. According to such method, the backed-up data page does not reside on the page buffer, but actually on the non-volatile section of the memory device containing the mirror buffer. However, since a flash memory device has a limited number of write-erase cycles, implementing such a method would decrease the lifetime of this flash memory device, and so is not recommended.

The present invention is described herein as implemented using a NAND flash memory device. However, it can be understood that other implementations are possible within the scope of the invention, thus relating to any system and method utilizing an area of memory for temporary storage on the flash memory device itself, rather than on the flash controller.

Having described the invention with regard to certain specific embodiments thereof, it is to be understood that the description is not meant as a limitation, since further modifications will now suggest themselves to those skilled in the art, and it is intended to cover such modifications as fall within the scope of the appended claims.

The invention claimed is:

1. A flash memory system comprising:
   (a) at least two flash memory devices, each said flash memory device having at least one respective page buffer allocated therein as temporary storage area for data to be programmed in a first of said flash memory devices, the page buffer of a second of said flash memory devices acting as a backup copy for the data to be programmed in the first flash memory device; and
   (b) a flash controller operative:
     (i) to transmit data from an area designated for temporary storage of said controller both to the respective page buffer of the first said flash memory device and to the respective page buffer of the second said flash memory device, the transmitting of data further includes defining a page address within the first said flash memory device and the second said flash memory device to which the transmitted data is to be programmed;
     (ii) to allocate the area designated for temporary storage of the data on said controller for other data upon successfully transmitting said data to the respective page buffer of first flash memory device and the respective page buffer of the second flash memory device;
     (iii) subsequent to said transmitting, to program said data in said first flash memory device from said respective page buffer of said first flash memory device at the defined page address;
     (iv) to check a programming failure of said programming of said data in said first flash memory device,
     (v) in case of said programming failure in said first flash memory device, to program said data into said second flash memory device at the defined page address from said respective page buffer of said second flash memory device to which said data has been transmitted; and
     (vi) to read data from said second flash memory device subsequent to programming said data into said second flash memory device,
   wherein when the page address for the second flash memory device is already in use, a page address is preselected by the controller to be available for use in failure recovery.

2. The flash memory system of claim 1, wherein said controlling is implemented in software.

3. The flash memory system of claim 1, wherein said controlling is implemented in hardware.

4. The flash memory system of claim 1, wherein said controlling is implemented by a combination of software and hardware.

5. The flash memory system of claim 1, wherein said controller is operative to transmit said data in parallel to said respective page buffer of said first flash memory device and said respective page buffer of said second flash memory device.

6. The flash memory system of claim 1, wherein said controller is operative to transmit said data consecutively to said respective page buffer of said first flash memory device and said respective page buffer of said second flash memory device.

7. The flash memory system of claim 1, wherein said flash memory devices are NAND flash memory devices.

8. A method for managing a flash memory system, the method comprising the steps of, upon the system receiving an instruction from a host to store data, obeying the instruction by:
   (a) transmitting data from a temporary storage of a controller of the flash memory system to a first respective page buffer allocated within a first flash memory device of the flash memory system;
   (b) also transmitting said data from the temporary storage of the controller of the flash memory system to a second respective page buffer allocated within a second flash memory device of the flash memory system, wherein the first page buffer and the second page buffer act as temporary storage area for data to be programmed in the first flash memory device, the page buffer of the second flash memory device acting as a backup copy for said data to be programmed in the first flash memory device and wherein the transmitting of data includes defining a page address within the first flash memory device and the second flash memory device into which the transmitted data is to be programmed;
   (c) allocating the temporary storage of the controller of the flash memory system that is used for transmitting the data to the respective page buffer of the first flash memory device and the respective page buffer of the second flash memory device for storing new data upon successfully transmitting the data from the temporary storage of the controller of the flash memory system to the respective page buffers of the first flash memory device and the second flash memory device;
   (d) subsequent to said transmitting of said data to both said first and second page buffers, programming said data to a non-volatile memory of said first flash memory device at the defined page address;
   (e) checking a programming failure of said programming of said data to said non-volatile memory of said first flash memory device;
   (f) in case of said programming failure in said first flash memory device, programming said data to a non-volatile memory of said second flash memory device at the defined page address from said second respective page buffer; and
   (g) subsequent to said programming of said data into said non-volatile memory of said second flash memory device, reading said data from said non-volatile memory of said second flash memory device,
   wherein when the page address for the second flash memory device is already in use, a page address is preselected by the controller to be available for use in failure recovery.

9. The method of claim 8, wherein said steps of transmitting are carried out in parallel.

10. The method of claim 8, wherein said steps of transmitting are carried out consecutively.

* * * * *